United States Patent
Fukuhara (10) Patent No.: US 12,062,904 B2
(45) Date of Patent: Aug. 13, 2024

(54) CURRENT SENSE CIRCUIT

(71) Applicant: DENSO CORPORATION, Kariya (JP)

(72) Inventor: Jun Fukuhara, Kariya (JP)

(73) Assignee: DENSO CORPORATION, Kariya (JP)

( * ) Notice: Subject to any disclaimer, the term of this patent is extended or adjusted under 35 U.S.C. 154(b) by 503 days.

(21) Appl. No.: 17/496,593

(22) Filed: Oct. 7, 2021

(65) Prior Publication Data

US 2022/0029410 A1   Jan. 27, 2022

Related U.S. Application Data

(63) Continuation of application No. PCT/JP2020/015064, filed on Apr. 1, 2020.

(30) Foreign Application Priority Data

Apr. 11, 2019   (JP) .................. 2019-075857

(51) Int. Cl.

| | |
|---|---|
| H03F 1/02 | (2006.01) |
| G01R 19/00 | (2006.01) |
| H02H 1/00 | (2006.01) |
| H02H 7/20 | (2006.01) |
| H03F 3/45 | (2006.01) |

(52) U.S. Cl.
CPC .......... *H02H 7/20* (2013.01); *G01R 19/0092* (2013.01); *H02H 1/0007* (2013.01); *H03F 3/45475* (2013.01); *H03F 2200/426* (2013.01)

(58) Field of Classification Search
CPC ........ H02H 7/20; H02H 1/0007; H02H 3/087; G01R 19/0092; H03F 3/45475; H03F 2200/426; H03K 17/00; H03K 17/08

USPC .......................................................... 330/127
See application file for complete search history.

(56) References Cited

U.S. PATENT DOCUMENTS

| | | | |
|---|---|---|---|
| 2002/0024376 A1* | 2/2002 | Sander ............... | H03K 17/0822 327/407 |
| 2005/0231177 A1 | 10/2005 | Tateno et al. | |
| 2007/0236204 A1 | 10/2007 | Tateno et al. | |
| 2008/0129273 A1 | 6/2008 | Tateno et al. | |

(Continued)

FOREIGN PATENT DOCUMENTS

JP    H09-145749 A   6/1997

*Primary Examiner* — Andrea Lindgren Baltzell
*Assistant Examiner* — Khiem D Nguyen
(74) *Attorney, Agent, or Firm* — Posz Law Group, PLC (57) ABSTRACT

A current sense circuit includes channels a detection terminal, a feedback circuit and third-type switches. The channels respectively have first-type switches and second-type switches. Each of the first-type switches supplies an electric power to a load when the first-type switch is turned on. The second-type switches are respectively connected to the first-type switches in parallel, and respectively detect currents flowing through the first-type switches. The detection terminal is connected to the second-type switches. The feedback circuit includes a single operational amplifier having a first input terminal and a second input terminal. The first input terminal is connected to respective electrodes of the first-type switches close to the load. The second input terminal is connected to respective electrodes of the second-type switches close to the detection terminal. The third-type switches are connected to the electrodes of the first-type switches and the first input terminal.

6 Claims, 6 Drawing Sheets

(56) References Cited

U.S. PATENT DOCUMENTS

2009/0267587 A1 10/2009 Tateno et al.
2015/0288171 A1 10/2015 Yoshida

* cited by examiner

CURRENT SENSE CIRCUIT

CROSS REFERENCE TO RELATED APPLICATIONS

The present application is a continuation application of International Patent Application No. PCT/JP2020/015064 filed on Apr. 1, 2020, which designated the U.S. and claims the benefit of priority from Japanese Patent Application No. 2019-075857 filed on Apr. 11, 2019. The entire disclosures of all of the above applications are incorporated herein by reference.

TECHNICAL FIELD

The present disclosure relates to a current sense circuit.

BACKGROUND

A current sense circuit may have a current detection circuit. In the current detection circuit, a sense metal oxide semiconductor field effect transistor (sense MOSFET) may be connected to a power oxide semiconductor field effect transistor (power MOSFET) in parallel, and a voltage across the terminals of both of the MOSFETs may be made to be constant through a feedback circuit having an operational amplifier.

SUMMARY

The present disclosure describes a current sense circuit including multiple channels, a feedback circuit, and a detection terminal.

BRIEF DESCRIPTION OF DRAWINGS

Objects, features and advantages of the present disclosure will become more apparent from the following detailed description made with reference to the accompanying drawings. In the drawings.

DETAILED DESCRIPTION

A current sense circuit may detect currents flowing through multiple channels. In a situation where a current detect circuit in the current sense circuit detects the currents flowing through the multiple channels, it may be required that the number of the operational amplifiers are provided correspondingly to the number of channels. Therefore, as the number of operational amplifiers increases, the physical size of the current detection circuit may become larger.

According to an aspect of the present disclosure, a current sense circuit includes channels, a detection terminal, a feedback circuit and third-type switches. The channels respectively have first-type switches and second-type switches. Each of the first-type switches supplies an electric power to a load when the first-type switch is turned on. The second-type switches are respectively connected to the first-type switches in parallel, and respectively detect currents flowing through the first-type switches. The detection terminal is connected to the second-type switches. The feedback circuit includes one operational amplifier having a first input terminal and a second input terminal. The first input terminal is connected to respective electrodes of the first-type switches close to the load. The second input terminal is connected to respective electrodes of the second-type switches close to the detection terminal. The feedback circuit receives a terminal voltage between corresponding one of the first-type switches and corresponding one of the second-type switches in each one of the channels. The third-type switches are connected to the electrodes of the first-type switches and the first input terminal. The third-type switches respectively have bidirectional withstand voltage. Each one of the third-type switches connected to corresponding one of the first-type switches is turned on in a condition that the corresponding one of the first-type switches is a target driven switch as a detected target to be driven for supplying the electric power to the load, and is turned off in a condition that the corresponding one of the first-type switch is a non-target driven switch as a non-detected target not to be driven for supply the electric power to the load.

According to the above aspect of the present disclosure, since the third-type switches are provided, it is possible to suppress the interference of a channel being the non-detected target, when the current flowing through another channel being the detected target is detected. Therefore, one operational amplifier can be commonly provided for the multiple channels. It is possible to inhibit the enlargement of the physical size according to the present disclosure, as compared with the structure where multiple operational amplifiers are respectively provided for the multiple channels.

As follows, multiple embodiments for implementing the present disclosure will be described with reference to the drawings. In each embodiment, portions corresponding to those described in the preceding embodiment are denoted by the same reference numerals, and redundant descriptions will be omitted in some cases. In each embodiment, in a case where only a part of the configuration is described, the other part of the configuration may be applied with reference to the other embodiment described above.

First Embodiment

A current sense circuit 100 according to this embodiment will be described with reference to FIGS. 1, 2, and 3. The current sense circuit 100 detects a current flowing through each of drive switches 11, 21 respectively for driving loads 310, 320. In other words, the current sense circuit 100 detects currents through multiple channels. The present embodiment describes a circuit for detecting currents through two channels. The present disclosure is not merely limited to the above example. The present disclosure may also adopt a circuit detecting currents through three or more channels. Each of the drive switches 11, 21 may also be referred to as a first-type switch.

Figure 1:
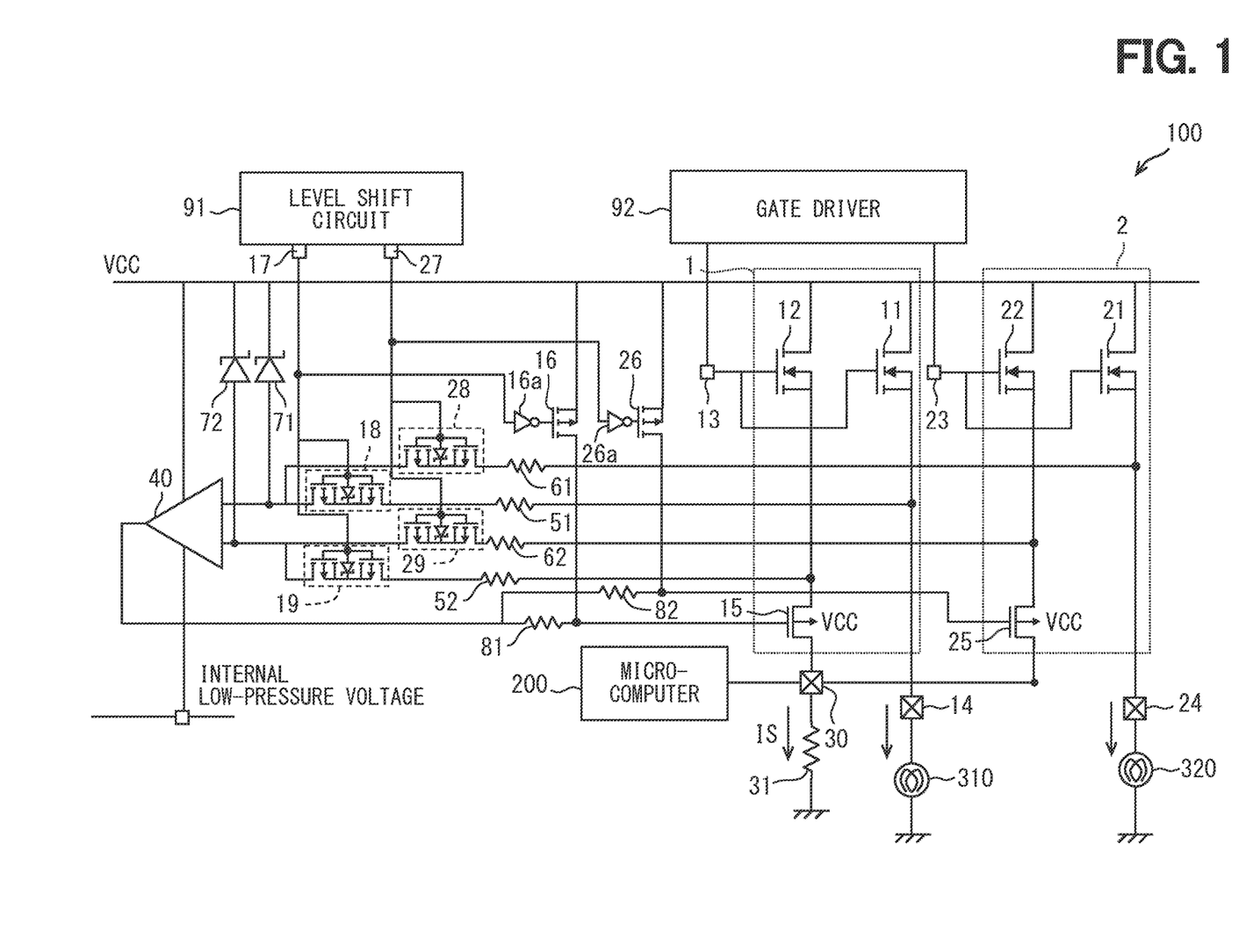
FIG. 1 is a circuit diagram showing a schematic configuration of a current sense circuit according to the first embodiment.
Figure 3:
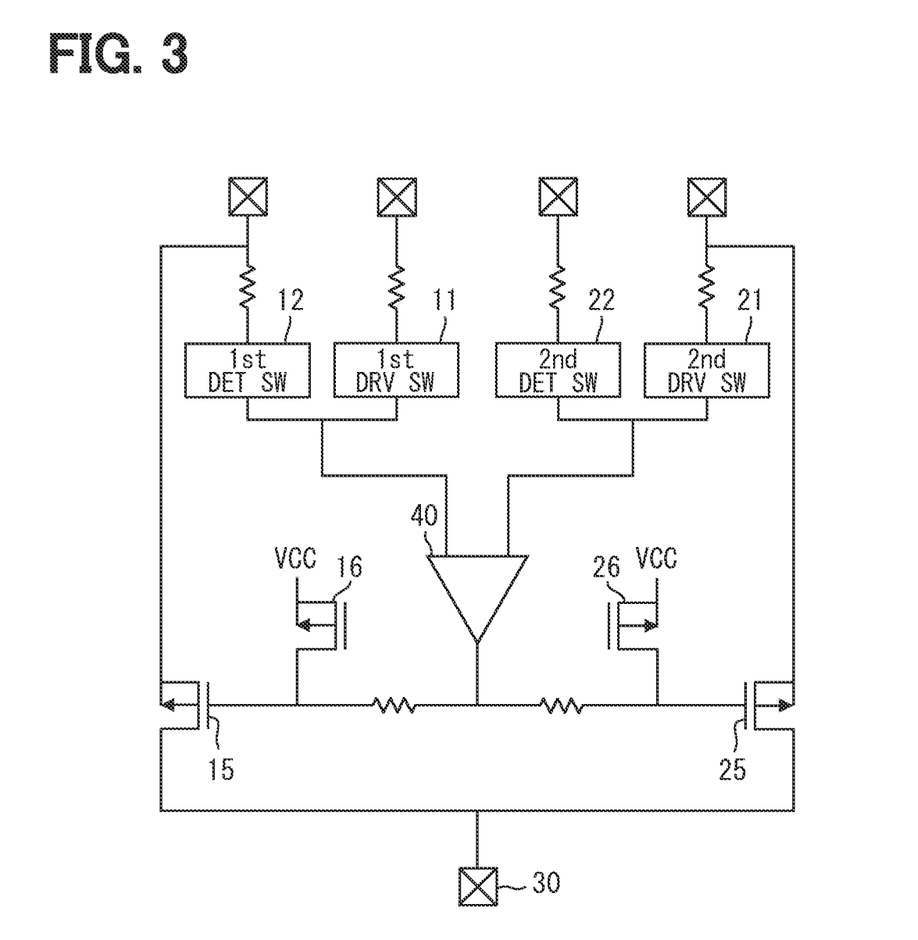
FIG. 3 is an element layout diagram showing a schematic configuration of the current sense circuit according to the first embodiment.

The following describes the configuration of the current sense circuit 100 with reference to FIGS. 1, 3. The current sense circuit 100 is electrically connected to a level shift circuit 91, a gate driver 92, a microcomputer 200, a first load 310, and a second load 320. However, the present disclosure may also adopt the current sense circuit 100 having the level shift circuit 91 and the gate driver 92. In the following, "being electrically connected" may be simply referred to as "connected".

The level shift circuit 91 is connected to a first enable terminal 17 and a second enable terminal 27 of the current sense circuit 100. The level shift circuit 91 is connected to a gate electrode of a first drive-side element 18 and a gate electrode of a first detect-side element 19 through the first enable terminal 17. The level shift circuit 91 outputs an enable signal to turn on and off the first drive-side element 18 and the first detect-side element 19 through the first enable terminal 17.

The level shift circuit 91 is connected to a gate electrode of the second drive-side element 28 and a gate electrode of a second detect-side element 29 through the second enable terminal 27. The level shift circuit 91 outputs an enable signal to turn on and off the second drive-side element 28 and the second detect-side element 29 through the second enable terminal 27.

The gate driver 92 is connected to a first gate terminal 13 and a second gate terminal 23 of the current sense circuit 100. The gate driver 92 is connected to a gate electrode of the first drive switch 11 and a gate electrode of the first detect switch 12 through the first gate terminal 13. The gate driver 92 outputs a control signal to turn on and off the first drive switch 11 and the first detect switch 12 through the first gate terminal 13.

The gate driver 92 is connected to a gate electrode of a second drive switch 21 and a gate electrode of a second detect switch 22 through a second gate terminal 23. The gate driver 92 outputs a control signal to turn on and off the second drive switch 21 and the second detect switch 22 through the second gate terminal 23.

The microcomputer 200 is connected to a current detect terminal 30 of the current sense circuit 100. For example, an AD terminal of the microcomputer 200 is connected to the current detect terminal 30. The microcomputer 200 receives an input of a detected value of the current through the current detect terminal 30. The current detect terminal 30 is connected to respective source electrodes of the detect switches 12, 22. The current detect terminal 30 is connected to the source electrode of the first detect switch 12 through a first output stage switch 15. The current detect terminal 30 is connected to the source electrode of the second detect switch 22 through a second output stage switch 25. The current detect terminal 30 may also be referred to as a detection terminal.

It is possible for the microcomputer 200 to control the drive of the level shift circuit 91 and the gate driver 92. In this situation, the level shift circuit 91 outputs an enable signal according to an instruction of the microcomputer 200. The gate driver 92 outputs a control signal according to the instruction of the microcomputer 200.

The current detect terminal 30 is connected to a ground through a current detect resistor 31. The current sense circuit 100 returns a detected value, which is obtained by converting a sense current IS to a voltage, to the AD terminal of the microcomputer 200. The microcomputer 200 determines a fault such as an open circuit or a short circuit in the loads 310, 320 based on, for example, the detected value. In a situation where the microcomputer 200 determines the fault based on the detected value, the microcomputer 200 can protect a system and the current sense circuit 100 by providing an instruction to stop the drive of the loads 310, 320 if the load current is excessively large, in other words, the short circuit occurs. In a situation where the microcomputer 200 determines the fault based on the detected value, the microcomputer 200 can notify the system of the fault occurred in the load through, for example, diagnostic if the load current is excessively small, in other words, the open circuit occurs.

The first load 310 is connected to a first output terminal 14 of the current sense circuit 100. The first load 310 has a first end and a second end. The first end of the first load 310 is connected to the first output terminal 14, and the second end of the first load 310 is connected to the ground. The first output terminal 14 is connected to the source electrode of the first drive switch 11.

The second load 320 is connected to a second output terminal 24 of the current sense circuit 100. The second load 320 includes a first end and a second end. The first end of the second load 320 is connected to the second output terminal 24, and the second end of the second load 320 is connected to the ground. The second output terminal 24 is connected to the source electrode of the second drive switch 21.

The present embodiment adopts a light as an example of the first load 310 and the second load 320. However, the present embodiment may not be limited to the above example, the present embodiment may adopted, for example, a motor as the first load 310 and the second load 320.

The current sense circuit 100 includes channels 1, 2 respectively having the drive switches 11, 21 and the detect switches 12, 22. The first channel 1 includes the first drive switch 11 and the first detect switch 12. The first drive switch 11 supplies an electric power to the first load 310 when the first drive switch 11 is turned on. The first detect switch 12 is connected to be parallel to the first drive switch 11, and detects a current (drive current) flowing through the first drive switch 11. The first channel 1 may be regarded as having the first output stage switch 15. The drive current may also be referred to as a load current. Each of the detect switches 12, 22 may also be referred to as a second-type switch.

The present embodiment adopts an n-channel MOSFET as the first drive switch 11 and the first detect switch 12. The present embodiment adopts a p-channel MOSFET as the first output stage switch 15. However, the present embodiment may not be limited to the above example, the present embodiment may adopt, for example, an insulated gate bipolar transistor (IGBT). The above matter may also be applied to the second drive switch 21 and the second detect switch 22.

The first drive switch 11 and the first detect switch 12 are disposed on an identical semiconductor chip. The first detect switch 12 has a structure identical to the first drive switch 11, and the area of the first detect switch 12 is set according to a current flowing through the first drive switch 11 and a detected current. The area of the first detect switch 12 is tens to tens of thousands of the area of the first drive switch 11. In other words, the sense current IS corresponding to the drive current flowing through the first drive switch 11 flows through the first detect switch 12.

The first drive switch 11 and the first detect switch 12 respectively have drain electrodes and gate electrodes. The drain electrodes are connected to a power supply VCC, and the gate electrodes are connected to the first gate terminal 13. The respective gate electrodes of the first drive switch 11 and the first detect switch 12 are connected to the common first gate terminal 13. Therefore, the first drive switch 11 and the first detect switch 12 are turned on at an identical timing and turned off at an identical timing.

The first drive switch 11 has a source electrode connected to the first output terminal 14. The first detect switch 12 has a source electrode connected to the source electrode of the first output stage switch 15. The first output stage switch 15 has a gate electrode connected to the output terminal of an operational amplifier 40 through a first coupling resistor 81, and has a drain electrode connected to a current detect terminal 30.

The first output stage switch 15 is a switch for switching whether or not to output the detected value of the first detect switch 12 from the current detect terminal 30. The second channel 2 is provided with a second output stage switch 25, which is similar to the first output stage switch 15. The output stage switches 15, 25 are respectively connected to the detect switches 12, 22. The output stage switches 15, 25 are respectively connected to electrodes of the detect switches 12, 22 near the current detect terminal 30, and are connected to the current detect terminal 30. The output stage switches 15, 25 are switches to switch the channel for outputting the detected value from the current detect terminal 30.

The second channel 2 includes the second drive switch 21 and the second detect switch 22. The second drive switch 21 supplies an electric power to the second load 320 when the second drive switch 21 is turned on. The second detect switch 22 is connected to be parallel to the second drive switch 21, and detects a current flowing through the second drive switch 21. The second channel 2 may be regarded as having the second output stage switch 25. The second channel 2 has a structure identical to the structure of the first channel 1. Each configuration element in the second channel 2 may be referred to the description of each configuration element in the first channel 1.

The current detect terminal 30 is commonly provided for the first detect switch 12 and the second detect switch 22. In other words, the current sense circuit 100 includes one current detect terminal 30 for the channels 1, 2. The current sense circuit 100 cannot output the respective detected values of the channels 1, 2 at the same timing. In other words, the current sense circuit 100 outputs the respective detected values at different timings.

The current sense circuit 100 has a structure in which the current detect terminal 30 is commonly provided for the first detect switch 12 and the second detect switch 22. Therefore, it is possible to reduce the number of AD terminals in the microcomputer 200. In other words, in a situation the current sense circuit 100 includes multiple current detect terminals 30 respectively for the detect switches 12, 22, two AD terminals for the microcomputer 200 are needed. However, the current sense circuit 100 can output detected values of two channels by connecting to one AD terminal of the microcomputer 200.

The current sense circuit 100 has a first channel circuit provided for the first channel 1. The first channel circuit includes a first changeover switch 16, a first inverter 16a, a first drive-side element 18 and a first detect-side element 19. The current sense circuit 100 has a second channel circuit provided for the second channel 2. The second channel circuit includes a second changeover switch 26, a second inverter 26a, a second drive-side element 28 and a second detect-side element 29. The first channel circuit and the second channel circuit have identical structures. Thus, the following describes the first channel circuit as a representative example.

The first changeover switch 16 is a switch for switching on and off the first output stage switch 15 according to the enable signal from the level shift circuit 91. The first changeover switch 16 is connected to the first enable terminal 17 through the first inverter 16a. The present embodiment adopts a p-channel MOSFET as the first changeover switch 16.

The first changeover switch 16 has a gate electrode connected to the first inverter 16a. Therefore, the enable signal is applied to the gate electrode of the first changeover switch 16 through the first inverter 16a. The first changeover switch 16 has a source electrode connected to the power supply VCC, and has a drain electrode connected to the gate electrode of the first output stage switch 15. Therefore, the first changeover switch 16 is applied with a different enable signal at a timing identical to the first drive-side element 18 and the first detect-side element 19.

The first drive-side element 18 corresponds to a drive bi-directional switch having a bidirectional withstand voltage. The first drive-side element 18 is connected to a source electrode as an electrode of the first drive switch 11 at the load side, and is connected to the first input terminal of the operational amplifier 40.

The first drive-side element 18 includes two p-channel MOSFETs. The respective source electrodes of the p-channel MOSFETs are connected to form a bidirectional withstand voltage. With regard to the first drive-side element 18, the drain electrode of one of the p-channel MOSFET is connected to the operational amplifier 40, and the drain electrode of the other one of the p-channel MOSFET is connected to the first output terminal 14 through a first drive resistor 51. With regard to the first drive-side element 18, the respective gates of two p-channel MOSFETs are connected to the first enable terminal 17. The second drive-side element 28 is connected to the second output terminal 24 through a second drive resistor 61.

The present embodiment adopts a first drive-side element 18 including a Zener diode for protecting each p-channel MOSFET. However, the present disclosure is not limited to the above example, and the Zener diode may not be provided.

The first drive-side element 18 is a switch for switching whether to input the source voltage of the first drive switch 11 to the operational amplifier 40. The first drive-side element 18 is turned on when the first drive switch 11 is a detected target, and is turned off when the second drive switch 21 is a detected target. In other words, in a situation where the first drive switch 11 is the detected target, in the current sense circuit 100, the first drive-side element 18 is turned on, and the second drive-side element 28 is turned off. In a situation where the second drive switch 21 is the detected target, in the current sense circuit 100, the first drive-side element 18 is turned off, and the second drive-side element 28 is turned on.

The first drive switch 11 corresponds to a target driven switch in a situation where the first drive switch 11 itself is a detected target, and corresponds to a non-target driven switch in a situation where the second drive switch 21 is a detected target. The first detect switch 12 corresponds to a target detect switch in a situation where the first drive switch 11 is a target driven switch, and corresponds to a non-target detect switch in a situation where the second drive switch 21 is a target driven switch.

The first drive-side element 18 has a bidirectional withstand voltage to suppress the interference caused by the first channel 1, in a situation where the second drive switch 21 is the detected target, in other words, the first drive switch 11 is the non-target driven switch. In other words, the first drive-side element 18 has the bidirectional voltage so as not to affect the detected result of the second drive switch 21 as the detected target. The first drive-side element 18 has the bidirectional voltage to ensure that the first drive switch 11 is turned off in a situation where the first drive switch 11 is the non-target driven switch.

In the current sense circuit 100, in a situation where the second drive switch 21 is the detected target, the enable signal indicative of turning on is sent to the second drive-side element 28, and the enable signal indicative of turning off is sent to the first drive-side element 18. As the first drive-side element 18 has the bidirectional withstand voltage, it is possible to ensure the first drive-side element 18 to be turned off. Therefore, the first input terminal of the operational amplifier 40 receives the source voltage of the second drive switch 21 without getting the influence of the first channel 1. In other words, since the first drive-side element 18 has the bidirectional withstand voltage, it is possible for the first drive-side element 18 to inhibit a situation in which the source voltage of the first drive switch 11 is superimposed on the source voltage of the second drive switch 21 sent to the first input terminal. The operational amplifier 40 will be described hereinafter.

The first detect-side element 19 corresponds to a detect-side bidirectional switch having a bidirectional withstand voltage. The first detect-side element 19 is connected to the source electrode as the electrode of the first detect switch 12 at the current detect terminal 30, and the second input terminal of the operational amplifier 40.

The first detect-side element 19 includes two p-channel MOSFETs. The respective source electrodes of the p-channel MOSFETs are connected to form a bidirectional withstand voltage. With regard to the first detect-side element 19, the drain electrode of one of the p-channel MOSFET is connected to the operational amplifier 40, and the drain electrode of the other one of the p-channel MOSFET is connected to the source electrode of the first output stage switch 15 through a first detect resistor 52. In other words, the first detect-side element 19 is connected to the current detect terminal 30 through the first detect resistor 52 and the first output stage switch 15. With regard to the first drive-side element 18, the respective gates of two p-channel MOSFETs are connected to the first enable terminal 17. In other words, the second detect-side element 29 is connected to the current detect terminal 30 through the second detect resistor 62 and the second output stage switch 25.

The respective gate electrodes of the first drive-side element 18 and the first detect-side element 19 are connected to the common first enable terminal 17. Therefore, the first drive-side element 18 and the first detect-side element 19 are applied with the identical enable signal at the identical timing.

The present embodiment adopts a first detect-side element 19 including a Zener diode for protecting each p-channel MOSFET. However, the present disclosure is not limited to the above example, and the Zener diode may not be provided.

The first detect-side element 19 is a switch for switching whether to input the source voltage of the first detect switch 12 to the operational amplifier 40. The first detect-side element 19 is turned on when the first drive switch 11 is a detected target, and is turned off when the second drive switch 21 is a detected target. In other words, in a situation where the first drive switch 11 is the detected target, in the current sense circuit 100, the first detect-side element 19 is turned on, and the second detect-side element 29 is turned off. In other words, in a situation where the first drive switch 11 is the detected target, in the current sense circuit 100, the first detect-side element 19 is turned off, and the second detect-side element 29 is turned on.

The first detect-side element 19 has a bidirectional withstand voltage to suppress the interference caused by the first channel 1, in a situation where the second drive switch 21 is the detected target, in other words, the first drive switch 11 is the non-target driven switch. In other words, the first detect-side element 19 has the bidirectional voltage so as not to affected the detected result of the second drive switch 21 as the detected target. The first detect-side element 19 has the bidirectional voltage to ensure that the first drive switch 11 is turned off in a situation where the first drive switch 11 is the non-target driven switch.

In the current sense circuit 100, in a situation where the second detect switch 22 is the detected target, the enable signal indicative of turning on is sent to the second detect-side element 29, and the disable signal indicative of turning off is sent to the first detect-side element 19. As the first detect-side element 19 has the bidirectional withstand voltage, it is possible to ensure the first detect-side element 19 to be turned off. Therefore, the second input terminal of the operational amplifier 40 receives the source voltage of the second detect switch 22 without getting the influence of the first channel 1. In other words, since the first detect-side element 19 has the bidirectional withstand voltage, it is possible for the first detect-side element 19 to inhibit a situation in which the source voltage of the first detect switch 12 is superimposed on the source voltage of the second detect switch 22 sent to the second input terminal.

The present embodiment adopts an example in which both of the drive-side elements 18, 28 and the detect-side elements 19, 29 are included. However, the present disclosure may include at least drive-side elements 18, 28. Each of the drive-side elements 18, 28 may also be referred to as a third-type switch. Each of the detect-side elements 19, 29 may also be referred to as a fourth-type switch.

The current sense circuit 100 includes the current sense terminal 30 and a feedback circuit. The feedback circuit adopts a voltage across the terminals of corresponding one of the drive switches 11, 21 and corresponding one of the detect switch 12, 22 in corresponding one of the channels. The feedback circuit adopts a voltage across the terminals of each of the first drive switch 11 and the first detect switch 12 and a voltage across the terminals of each of the second drive switch 21 and the second detect switch 22. The voltage across the terminals may also be referred to as a terminal voltage.

The feedback circuit includes the operational amplifier 40. The operational amplifier 40 is operated by being connected between the power supply VCC and an internal low-pressure voltage of the current sense circuit 100. The operational amplifier 40 includes a first input terminal, a second input terminal and an output terminal. The respective electrodes of the drive switches 11, 21 at the loads 310, 320 are connected to the first input terminal. The respective electrodes of the detect switches 12, 22 at the current sense terminal 30 are connected to the second input terminal. The output terminal is connected to the respective gate electrodes of the output stage switches 15, 25. Each of the output stage switches 15, 25 may also be referred to as a fifth-type switch.

The current sense circuit 100 includes the operational amplifier 40 commonly provided for the first channel 1 and the second channel 2. In other words, the current sense circuit 100 includes one operational amplifier 40 shared by two channels 1, 2. The operational amplifier 40 may also be referred to as a current sense amplifier.

A first protection element 71 is connected between the first input terminal of the operational 40 and the power supply VCC, and a second protection element 72 is connected between the second input terminal of the operational amplifier 40 and the power supply VCC. Each of the protection elements 71, 72 adopts a Zener diode. Each of the protection elements 71, 72 protects the operational amplifier 40 by maintaining a voltage applied to the operational amplifier 40 in a range where a voltage does not exceed the internal low-pressure voltage as a reference voltage.

The current sense circuit 100 can adopt the operational amplifier 40 with a lower withstand voltage by including two protection elements 71, 72. The current sense circuit 100 can adopt a low withstand voltage corresponding to a voltage based on the internal low-pressure voltage, and it is not required to adopt a high withstand voltage corresponding to a voltage based on the ground. Two protection elements 71, 72 correspond to a protection circuit. However, two protection elements 71, 72 may not be included.

The feedback circuit may include the drive-side elements 18, 28 and the detect-side elements 19, 29. Additionally, the feedback circuit may include the drive resistors 51, 61 and the detect resistors 52, 62. The feedback circuit may include the output stage switches 15, 25 and the coupling resistors 81, 82.

The present embodiment adopts the first coupling resistor 81 and the second coupling resistor 82, which are respectively connected to the respective gate electrodes (control terminals) of the output stage switches 15, 25 and the output terminal of the operational amplifier 40. In the current sense circuit 100, the first output stage switch 15 and the second output stage switch 25 are resistive coupled by the first coupling resistor 81 and the second coupling resistor 82. However, two coupling resistors 81, 82 may not be included. The coupling resistors 81, 82 correspond to resistive elements. Since the current sense circuit 100 has resistive coupling, a switch elements such as a multiplexer is not needed to be provided between each of the output stage switches 15, 25 and the current detect terminal 30. In other words, when the current sense circuit 100 turns on the first output stage switch 15, the current sense circuit 100 can turn off the second output stage switch 25 by turning on the second changeover switch 26 provided between the second coupling resistor 82 and the gate of the second output stage switch 25. Therefore, the current sense circuit 100 may not require a switch element provided between the second output stage switch 25 and the current detect terminal 30. In a situation where the coupling resistors 81, 82 are not provided, the respective gate potentials of the output stage switches 15, 25 are identical, and the output stage switches 15, 25 cannot be respectively controlled. Each of the coupling resistors 81, 82 may also be simply referred to as a resistor.

As illustrated in FIG. 3, the current sense circuit 100 may have an element layout in which the arrangement of the configuration elements described above has symmetry. In other words, the current sense circuit 100 may also have symmetry for the configuration elements commonly provided for the channels 1, 2. Therefore, it is possible to for the current sense circuit 100 to suppress the characteristic difference between the first channel 1 and the second channel 2.

Figure 2:
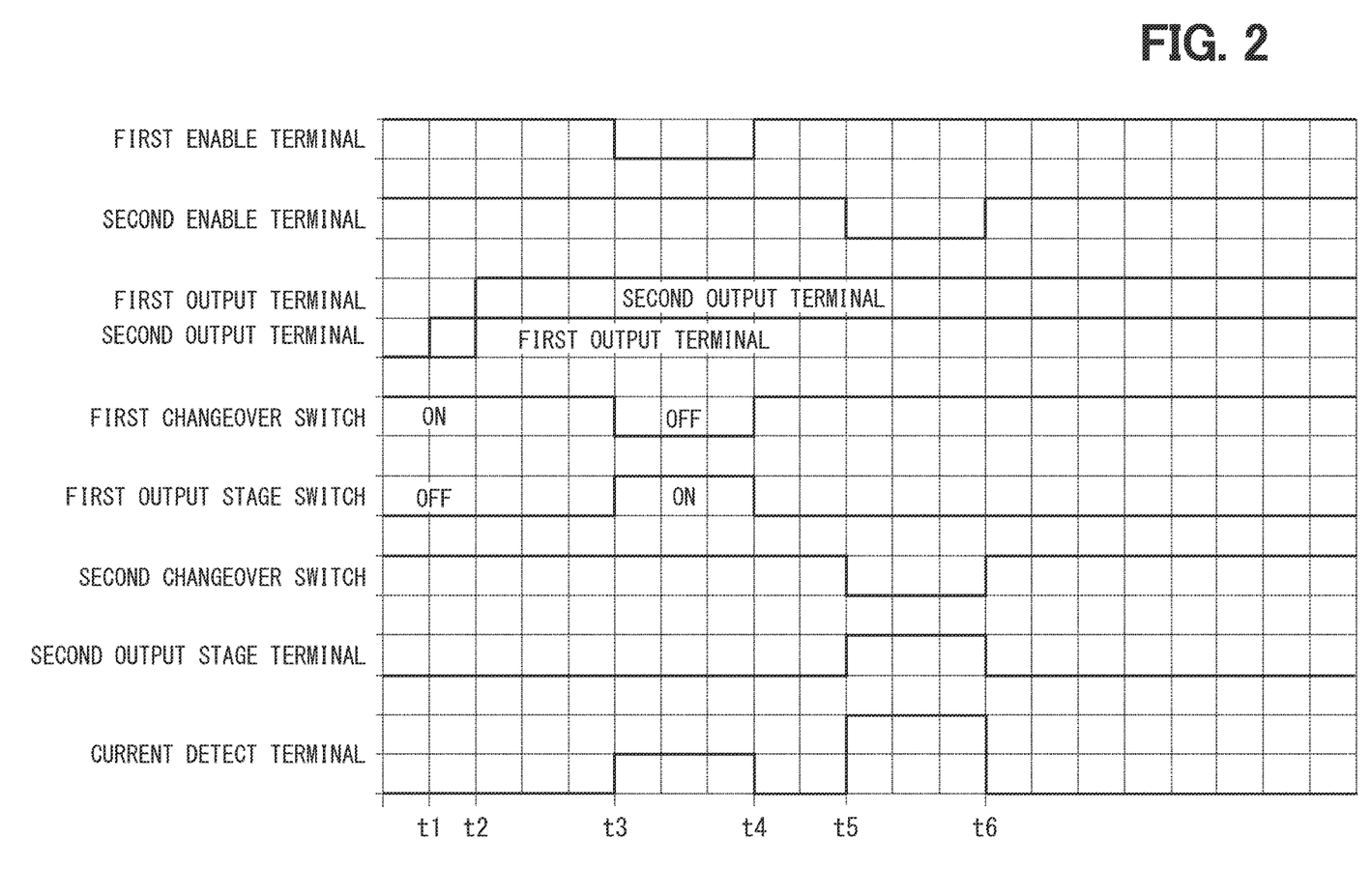
FIG. 2 is a timing chart showing an operation of the current sense circuit according to the first embodiment.

The following describes the operation of the current sense circuit 100 with reference to FIG. 2. The present embodiment illustrates that the signal level of the first drive switch 11 is different from the signal level of the second drive switch 21 to understand the timing chart. However, the present disclosure is not only limited to the above example. FIG. 2 illustrates that the first drive switch 11 is turned on at timing t1, and the second drive switch 21 is turned on at the timing t2. Therefore, in the current sense circuit 100, a drive current flows through the first drive switch 11 from the timing t1, and the drive current flows through the second drive switch 21 from the timing t2.

The following describes a situation in which the drive current through the first channel is detected. At the timing t3, the first enable terminal 17 is set to a low level (L). At this timing, the second enable terminal 27 is set to a high level (H). The drive current through the first channel 1 is detected in a period between the timing t3 and the timing t4.

In the current sense circuit 100, when the first enable terminal 17 is turned to L, the first changeover circuit 16 is turned off, and the first output stage switch 15 is turned on. Therefore, the current sense circuit 100 outputs the sense current IS through the first detect switch 12. The current sense circuit 100 outputs the detected value corresponding to the current flowing through the first drive switch 11 from the current detect terminal 30.

At this timing, since the second enable terminal 27 is at H, the second changeover switch 26 is turned on, and the second output stage switch 25 is turned off. Therefore, it is possible for the current sense circuit 100 to stop the output of the sense current IS through the second detect switch 22.

In the current sense circuit 100, as the first enable terminal 17 is turned to L, the first drive-side element 18 and the first detect-side element 19 are turned on. Therefore, the operational amplifier 40 receives the source voltage of the first drive-side element 18 at the first input terminal, and receives the source voltage of the first detect-side element 19 at the second input terminal.

Since the second enable terminal 27 is at H, in the current sense circuit 100, the second drive-side element 28 and the second detect-side element 29 are turned off. Since the second drive-side element 28 and the second detect-side element 29 have the bidirectional withstand voltage as described above, the second drive-side element 28 and the second detect-side element 29 are surely turned off as the second enable terminal 27 is turned to H. Therefore, it is possible for the current sense circuit 100 to output the sense current IS through the first detect switch 12 while preventing from the interference of the second channel 2.

At the timing t4, the first enable terminal 17 is set to H. Therefore, in the current sense circuit 100, the first changeover switch 16 is turned on, and the first output stage switch 15 is turned off.

The following describes a situation in which the drive current through the second channel 2 is detected. At the timing t5, the second enable terminal 27 is set to L. At this timing, the first enable terminal 17 is set to a high level (H). The drive current through the second channel 2 is detected in a period between the timing t5 and the timing t6.

In the current sense circuit 100, when the second enable terminal 27 is turned to L, the second changeover circuit 26 is turned off, and the second output stage switch 25 is turned on. Therefore, the current sense circuit 100 outputs the sense current IS through the second detect switch 22. The current sense circuit 100 outputs the detected value corresponding to the current flowing through the second drive switch 21 from the current detect terminal 30.

At this timing, since the first enable terminal 17 is at H, the first changeover switch 16 is turned on, and the first output stage switch 15 is turned off. Therefore, it is possible for the current sense circuit 100 to stop the output of the sense current IS through the first detect switch 12.

In the current sense circuit 100, as the second enable terminal 27 is turned to L, the second drive-side element 28 and the second detect-side element 29 are turned on. Therefore, the operational amplifier 40 receives the source voltage of the second drive-side element 28 at the first input terminal, and receives the source voltage of the second detect-side element 29 at the second input terminal.

Since the first enable terminal 17 is at H, in the current sense circuit 100, the first drive-side element 18 and the first detect-side element 19 are turned off. Since the first drive-side element 18 and the first detect-side element 19 have the bidirectional withstand voltage as described above, the first drive-side element 18 and the first detect-side element 19 are surely turned off as the first enable terminal 17 is turned to H. Therefore, it is possible for the current sense circuit 100 to output the sense current IS through the second detect switch 22 while preventing from the interference of the first channel 1.

At the timing t6, the second enable terminal 27 is set to H. Therefore, in the current sense circuit 100, the second changeover switch 26 is turned on, and the second output stage switch 25 is turned off.

Since the current sense circuit 100 includes the drive-side elements 18, 28 controlled as described above, it is possible to suppress the interference of the channel being the non detected target when the current flowing through the channel being the detected target. In other words, it is possible for the current sense circuit 100 to have one operational amplifier 40 commonly provided for multiple channels 1, 2. Therefore, it is possible to make the physical size of the current sense circuit 100 to be smaller than the structure having multiple operational amplifiers 40 respectively provided for the multiple channels 1, 2.

It is possible for the current sense circuit 100 to shorten the adjustment time of, for example, trimming in the operational amplifier 40, as compared with the structure where the multiple operational amplifiers 40 are respectively provided for the multiple channels 1, 2. The cost for manufacturing the current sense circuit 100 may also be reduced. It is also possible to reduce the inspection time or cost for the current sense circuit 100.

The current sense circuit 100 further includes the detect-side elements 19, 29 in addition to the drive-side elements 18, 28. Therefore, it is possible that the current sense circuit 100 further suppress the channel being the non-detected target when the current flowing through the channel being the detected target is detected.

The current sense circuit 100 may include a multiplexer between the output stage switches 15, 25 and the current detect terminal 30. In other words, the current sense circuit 100 may have a structure in which only one of the first detect switch 12 and the second detect switch 22 is connected to the current detect terminal 30 through the multiplexer.

The first embodiment of the present disclosure has been described above. However, the present disclosure is not limited to the above-described embodiment in any manner, and various modifications are possible within a scope that does not depart from the gist of the present disclosure.

Second Embodiment

The following describes a current sense circuit 100a according to a second embodiment with reference to FIGS. 4 to 7. The present embodiment describes the differences between the current sense circuit 100a and the current sense circuit 100. The current sense circuit 100a is different from the current sense circuit 100 such that the current sense circuit 100a includes control circuits 12a, 22a.

Figure 4:
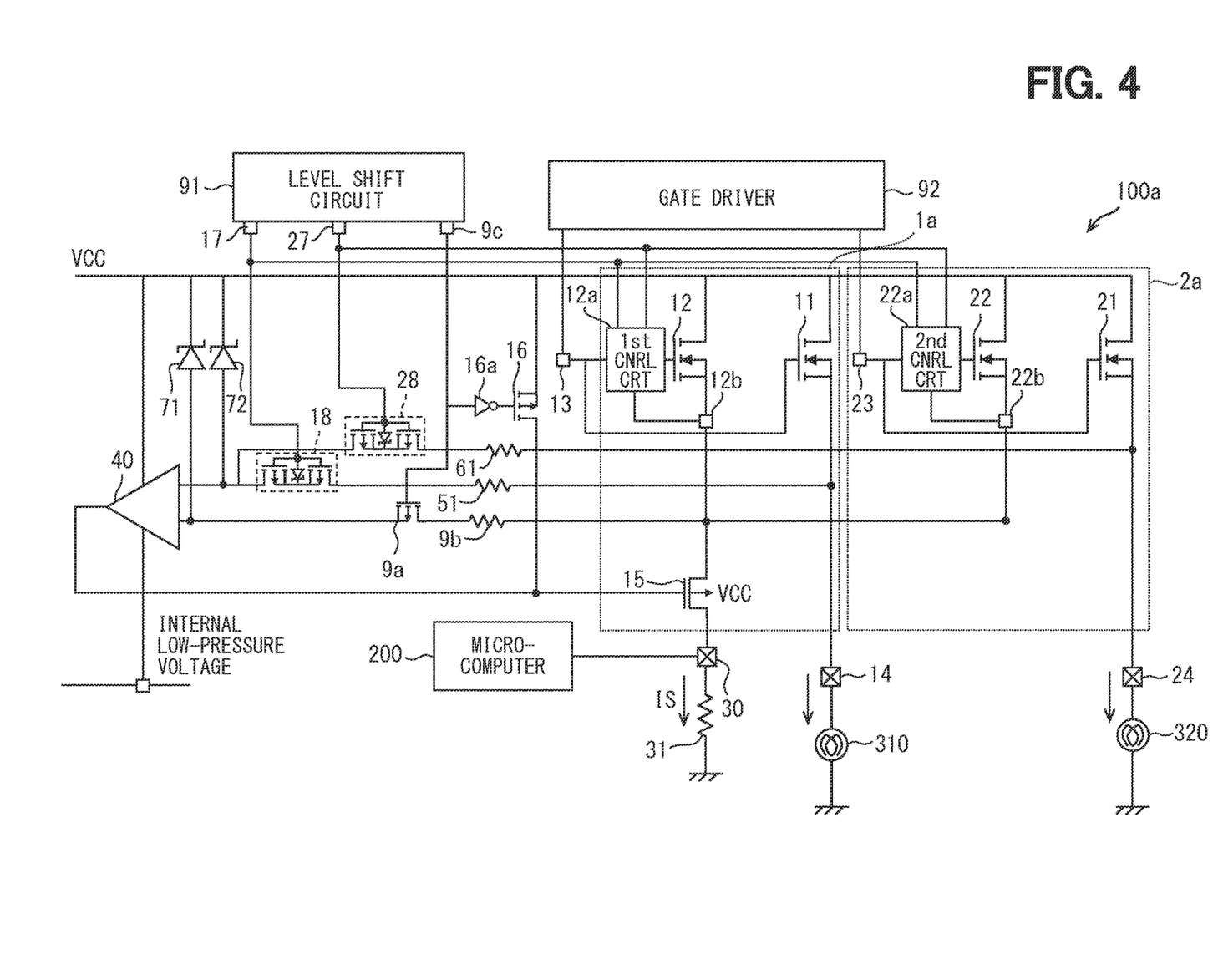
FIG. 4 is a circuit diagram showing a schematic configuration of a current sense circuit according to the second embodiment.

As illustrated in FIG. 4, the current sense circuit 100a includes a first channel 1a and a second channel 2a.

The first channel 1a includes the structure of the first channel 1, and further includes the first control circuit 12a and a first source terminal 12b. The first control circuit 12a is connected to the first detect switch 12, and turns on and off only the first detect switch 12. The first control circuit 12a is provided between the first gate terminal 13 and the gate electrode of the first detect switch 12. The first control circuit 12a is connected to the first enable terminal 17 and the second enable terminal 27. The first source terminal 12b is connected to the source electrode of the first detect switch 12 and the first control circuit 12a.

The second channel 2a includes the structure of the second channel 2, and further includes the second control circuit 22a and a second source terminal 22b. The current sense circuit 100a is connected to each of the detect switches 12, 22, and includes the control circuits 12a, 22a respectively for turning on and off only the detect switches 12, 22. The first channel 1a and the second channel 2a have a similar structure. The second channel 2a may be referred to the description of the first channel 1a.

The current sense circuit 100a includes a detect switchover switch 9a, a detect resistor 9b and a detect enable switch 9c. The detect changeover switch 9a adopts a p-channel MOSFET. The detect changeover switch 9a has a gate electrode connected to the detect enable terminal 9c, and has a source electrode connected to the second input terminal of the operational amplifier 40. The detect changeover switch 9a has a drain electrode connected to the source terminals 12b, 22b of the channels 1a, 2a through the detect resistor 9b.

The detect enable terminal 9c is connected to the level shift circuit 91. The detect enable terminal 9c is connected to the detect changeover switch 9a, and is also connected to the first inverter 16a. Therefore, the enable signal is sent to the gate electrodes of the detect changeover switch 9a and the first changeover switch 16.

The current sense circuit 100a includes only the first changeover switch 16 and the first inverter 16a respectively as a changeover switch and an inverter. Therefore, the current sense circuit 100a does not include the second changeover switch 26 and the second inverter 26a. The current sense circuit 100a includes only the first output switch 15 as the output stage switch. In other words, the current sense circuit 100a does not include the second output stage switch 25.

The current sense circuit 100a includes the drive-side elements 18, 28, but does not include the detect-side elements 19, 29. In the current sense circuit 100a, since the control circuits 12a, 22a can surely turn off the detect switches 12, 22, it is not required to provide the detect-side elements 19, 29.

Figure 5:
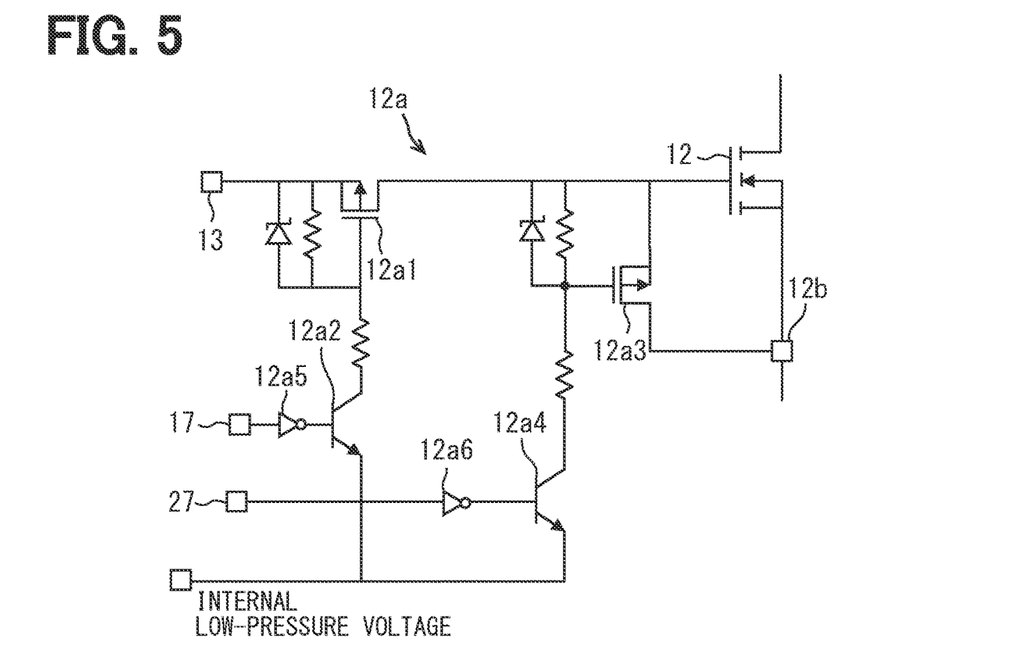
FIG. 5 is a circuit diagram showing a schematic configuration of the current sense circuit at a first channel in the second embodiment.
Figure 6:
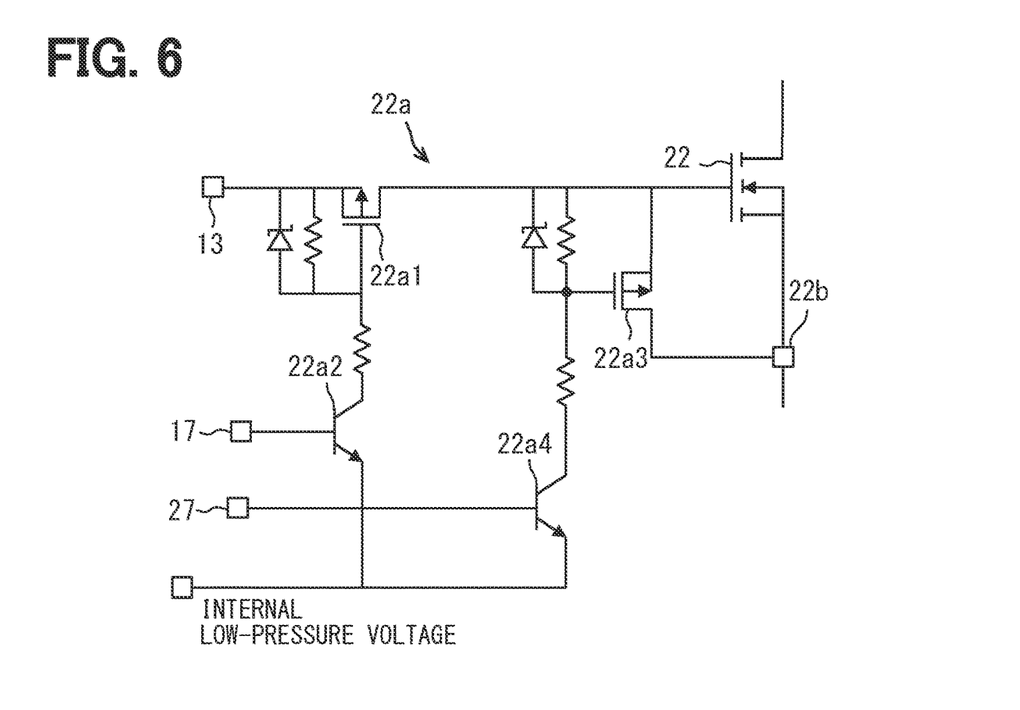
FIG. 6 is a circuit diagram showing a schematic configuration of the current sense circuit at a second channel in the second embodiment.

The following describes the structure of each of the control circuits 12a, 22a with reference to FIGS. 5, 6. The first control circuit 12a may adopt the structure such as the one illustrated in FIG. 5. The second control circuit 22a may adopt the structure such as the one illustrated in FIG. 6.

The first control circuit 12a includes a first switch 12a1, a second switch 12a2, a third switch 12a3, a fourth switch 12a4, a first control inverter 12a5, and a second control inverter 12a6. The second control circuit 22a includes a first switch 22a1, a second switch 22a2, a third switch 22a3 and a fourth switch 22a4. The first control circuit 12a includes the structure of the second control circuit 22a, and further includes the first control inverter 12a5 and the second control inverter 12a6.

Figure 7:
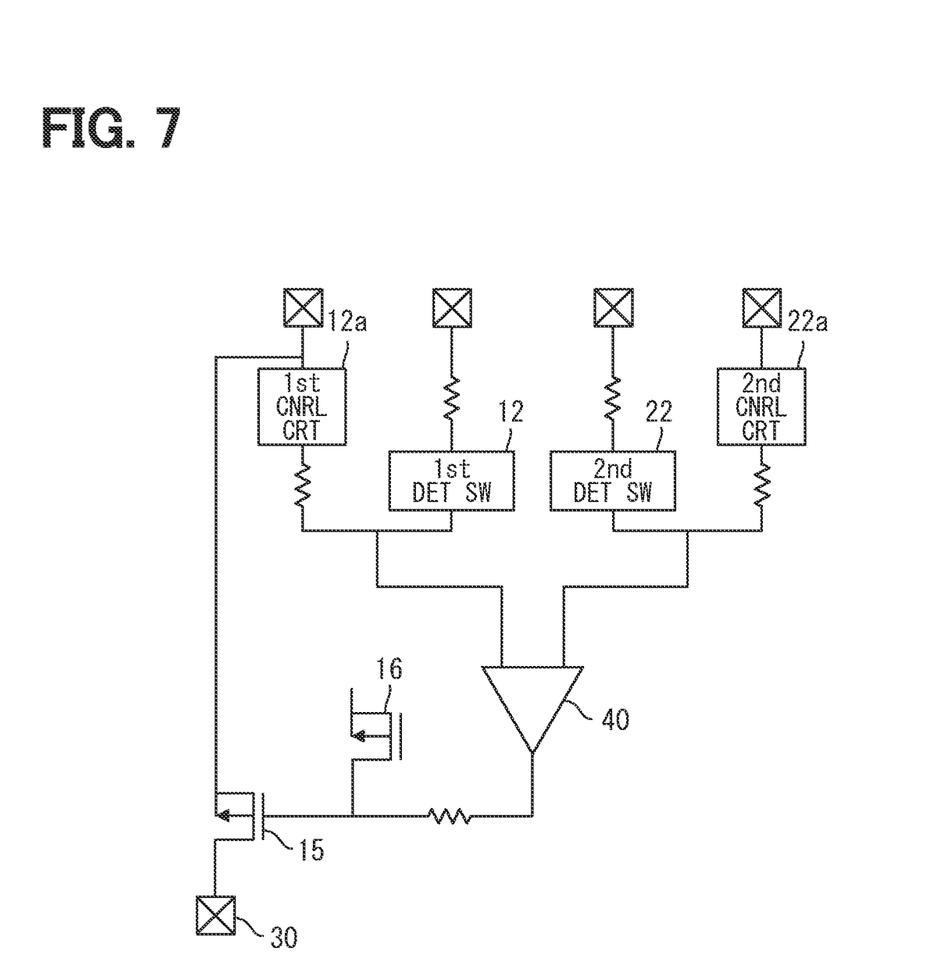
FIG. 7 is an element layout diagram showing a schematic configuration of the current sense circuit according to the second embodiment.

As illustrated in FIG. 7, the current sense circuit 100a may have an element layout similar to the current sense circuit 100 in which the arrangement of the configuration elements described above has symmetry.

The following describes the operation of the current sense circuit 100a. The following describes the structure of each of the control circuits 12a, 22a with reference to FIGS. 5, 6.

In a situation where the drive current in the first channel 1a is detected, the first enable terminal 17 is turned to L, and the second enable terminal 27 is turned to H. The first control circuit 12a turns on the second switch 12a2 and turns on the first switch 12a along with turning on the second switch 12a2 in a situation where the first enable terminal 17 is turned to L. The first control circuit 12a turns off the fourth switch 12a4 and turns off the third switch 12a3 along with turning off the fourth switch 12a4, in a situation where the second enable terminal 27 is turned to H.

The second control circuit 22a turns off the second switch 12a2 and turns off the first switch 22a1 along with turning off the second switch 22a2 in a situation where the first enable terminal 17 is turned to L. The second control circuit 22a turns on the fourth switch 12a4 and turns on the third switch 12a3 along with turning on the fourth switch 12a4, in a situation where the second enable terminal 27 is turned to H. Therefore, the second detect switch 22 is turned off due to having the short circuit between the gate and source.

In this example, the first drive switch 11 corresponds to a target driven switch, and the first detect switch 12 corresponds to a target detect switch in the same channel where the target driven switch is provided. The second drive switch 21 corresponds to a non-target driven switch, and the second detect switch 22 corresponds to the non-target detect switch in the same channel where the non-target driven switch is provided.

Each one of the control circuits 12a, 22a respectively connected to the detect switches 12, 22 turns on the target detect switch in one of the channels having the target driven switch. Each one of the control circuits 12a, 22a turns off the non-target detect switch in one of the channels having the non-target driven switch..

In a situation where the drive current through the second channel 2a is detected, the first enable terminal 17 is turned to H, and the second enable terminal 27 is turned to L. Therefore, the control circuits 12a, 22a operate in the opposite manner to the above description. Therefore, the first detect switch 12 is turned off due to having the short circuit between the gate and source.

The current sense circuit 100a includes the drive-side elements 18, 28, and includes the control circuits 12a, 22a. Therefore, it is possible for the current sense circuit 100a to generate the advantageous effect as the one in the current sense circuit 100.

The present disclosure has been described based on examples, but it is understood that the present disclosure is not limited to the examples or structures. The present disclosure encompasses various modifications and variations within the scope of equivalents. In addition, various combinations and configurations, as well as other combinations and configurations that include only one element, more, or less, fall within the scope and spirit of the present disclosure.

What is claimed is:

1. A current sense circuit comprising:
   a plurality of channels respectively including
      a plurality of first-type switches respectively configured to be turned on for supplying an electric power to a load, and
      a plurality of second-type switches respectively configured to be connected to the plurality of first-type switches in parallel for detecting respective currents flowing through the plurality of first-type switches;
   a detection terminal configured to be connected to the plurality of second-type switches;
   a feedback circuit including a single operational amplifier having a first input terminal and a second input terminal, the first input terminal configured to be connected to respective electrodes of the plurality of first-type switches close to the load, the second input terminal configured to be connected to respective electrodes of the plurality of second-type switches close to the detection terminal, the feedback circuit configured to receive a terminal voltage between corresponding one of the plurality of first-type switches and corresponding one of the plurality of second-type switches in each one of the plurality of channels; and
   a plurality of third-type switches respectively having bidirectional withstand voltages, and configured to be connected to the respective electrodes of the plurality of first-type switches and the first input terminal,
   wherein each one of the plurality of third-type switches connected to corresponding one of the plurality of first-type switches is further configured to be:
      turned on in a condition that the corresponding one of the plurality of first-type switches is a target driven switch as a detected target to be driven for supplying the electric power to the load; and
      turned off in a condition that the corresponding one of the plurality of first-type switches is a non-target driven switch as a non-detected target not to be driven for supplying the electric power to the load.

2. The current sense circuit according to claim 1, further comprising:
   a plurality of fourth-type switches respectively having bidirectional voltages and configured to be connected to the electrodes of the plurality of second-type switches and the second input terminal,
   wherein each one of the plurality of fourth-type switches connected to corresponding one of the plurality of second-type switches in corresponding one of the plurality of channels is further configured to be:
      turned on in a condition that the corresponding one of the plurality of channels has the target driven switch; and
      turned off in a condition that the corresponding one of the plurality of channels has the non-target driven switch.

3. The current sense circuit according to claim 2, further comprising:
   a plurality of fifth-type switches respectively configured to be connected to the plurality of second-type switches, and respectively connected to the electrodes of the plurality of second-type switches and the detection terminal; and a resistor configured to be connected to an output terminal of the single operational amplifier and a control terminal of each one of the plurality of fifth-type switches.

4. The current sense circuit according to claim 1, further comprising:

a plurality of control circuits respectively configured to be connected to the plurality of second-type switches to turn on and off the plurality of second-type switches, wherein each one of the plurality of control circuits connected to corresponding one of the plurality of second-type switches in corresponding one of the plurality of channels is further configured to:

turn on the corresponding one of the plurality of second-type switches in a condition that the corresponding one of the plurality of channels has the target driven switch; and turn off the corresponding one of the plurality of second-type switches in a condition that the corresponding one of the plurality of channels has the non-target driven switch.

5. The current sense circuit according to claim 1, wherein the detection terminal is commonly provided for the plurality of second-type switches.

6. The current sense circuit according to claim 1, further comprising:

a protection circuit configured to protect the single operational amplifier.

* * * * *